United States Patent
Jürgensen et al.

(10) Patent No.: US 7,147,718 B2
(45) Date of Patent: *Dec. 12, 2006

(54) DEVICE AND METHOD FOR THE DEPOSITION OF, IN PARTICULAR, CRYSTALLINE LAYERS ON, IN PARTICULAR, CRYSTALLINE SUBSTRATES

(75) Inventors: Holger Jürgensen, Aachen (DE); Gerhard Karl Strauch, Aachen (DE); Johannes Käppeler, Würselen (DE)

(73) Assignee: Aixtron AG (DE)

( * ) Notice: Subject to any disclaimer, the term of this patent is extended or adjusted under 35 U.S.C. 154(b) by 250 days.

This patent is subject to a terminal disclaimer.

(21) Appl. No.: 10/378,495

(22) Filed: Mar. 3, 2003

(65) Prior Publication Data

US 2004/0005731 A1    Jan. 8, 2004

Related U.S. Application Data

(63) Continuation of application No. PCT/EP01/08105, filed on Jul. 13, 2001.

(30) Foreign Application Priority Data

Sep. 1, 2000    (DE)    ................. 100 43 601

(51) Int. Cl.
C23C 16/455    (2006.01)
C23C 16/00     (2006.01)
C23C 16/23     (2006.01)

(52) U.S. Cl. .................. 118/715; 118/724; 156/345.33; 156/345.37

(58) Field of Classification Search ................ 118/715, 118/724, 725, 728, 730; 156/345.33, 345.37, 156/345.52, 345.55
See application file for complete search history.

(56) References Cited

U.S. PATENT DOCUMENTS

| | | | | |
|---|---|---|---|---|
| 3,696,779 | A * | 10/1972 | Murai et al. | 118/725 |
| 4,825,809 | A * | 5/1989  | Mieno        | 118/725 |
| 4,887,961 | A * | 12/1989 | Kuwabara et al. | 431/177 |
| 4,961,399 | A * | 10/1990 | Frijlink     | 118/730 |
| 5,106,453 | A * | 4/1992  | Benko et al. | 117/93 |
| 5,453,124 | A   | 9/1995  | Moslehi et al. | |
| 5,643,366 | A * | 7/1997  | Somekh et al. | 118/729 |
| 5,788,777 | A   | 8/1998  | Burk, Jr.    | |
| 5,851,299 | A * | 12/1998 | Cheng et al. | 118/729 |
| 5,871,586 | A * | 2/1999  | Crawley et al. | 118/715 |
| 5,954,881 | A * | 9/1999  | Burk et al.  | 118/715 |
| 5,958,140 | A * | 9/1999  | Arami et al. | 118/725 |

(Continued)

FOREIGN PATENT DOCUMENTS

GB    2312990    11/1997

(Continued)

*Primary Examiner*—Jeffrie R. Lund
(74) *Attorney, Agent, or Firm*—St. Onge Steward Johnston & Reens LLC

(57) ABSTRACT

The invention relates to a device and method for the deposition of in particular, crystalline layers on one or several, in particular, equally crystalline substrates in a process chamber, by means of reaction gases which are fed to the process chamber where they react pyrolytically. The process chamber has a first wall and a second wall, lying opposite the first. The first wall is provided with at least one heated substrate holder, to which at least one reaction gas is led by means of a gas inlet device. According to the invention, a premature decomposition of source gases and a local oversaturation of the gas flow with decomposition products may be avoided, whereby the gas inlet device is liquid cooled.

15 Claims, 4 Drawing Sheets

U.S. PATENT DOCUMENTS

| | | | |
|---|---|---|---|
| 6,039,812 A | 3/2000 | Ellison et al. | |
| 6,206,972 B1* | 3/2001 | Dunham | 118/715 |
| 6,579,372 B1* | 6/2003 | Park | 118/715 |
| 6,588,230 B1* | 7/2003 | Adler et al. | 65/17.3 |
| 6,786,973 B1* | 9/2004 | Strauch et al. | 118/715 |
| 6,905,548 B1* | 6/2005 | Jurgensen et al. | 118/715 |
| 6,972,050 B1* | 12/2005 | Bremser et al. | 117/93 |
| 7,033,921 B1* | 4/2006 | Jurgensen | 438/602 |
| 7,067,012 B1* | 6/2006 | Jurgensen et al. | 118/730 |
| 2002/0001953 A1* | 1/2002 | Heuken et al. | 438/689 |
| 2003/0057844 A1* | 3/2003 | Windhorn et al. | 315/111.01 |
| 2003/0177977 A1* | 9/2003 | Strauch et al. | 118/84 |
| 2003/0217696 A1* | 11/2003 | Jurgensen et al. | 118/715 |
| 2003/0221624 A1* | 12/2003 | Jurgensen et al. | 118/725 |
| 2004/0003779 A1* | 1/2004 | Jurgensen et al. | 118/723.001 |
| 2004/0005731 A1* | 1/2004 | Jurgensen et al. | 438/100 |
| 2004/0013801 A1* | 1/2004 | Bremser et al. | 427/255.28 |
| 2004/0129215 A1* | 7/2004 | Kaeppeler et al. | 118/715 |
| 2004/0200412 A1* | 10/2004 | Frijlink | 118/715 |
| 2004/0231599 A1* | 11/2004 | Schwambera et al. | 118/728 |
| 2005/0023402 A1* | 2/2005 | Jurgensen | 438/505 |
| 2005/0081788 A1* | 4/2005 | Jurgensen et al. | 118/718 |
| 2005/0098109 A1* | 5/2005 | Wakabayashi et al. | 118/715 |
| 2005/0106319 A1* | 5/2005 | Jurgensen et al. | 427/248.1 |

FOREIGN PATENT DOCUMENTS

| | | | |
|---|---|---|---|
| JP | 6110767 | | 5/1986 |
| JP | 61-135114 | * | 6/1986 |
| WO | WO 99/43874 | | 9/1999 |

* cited by examiner

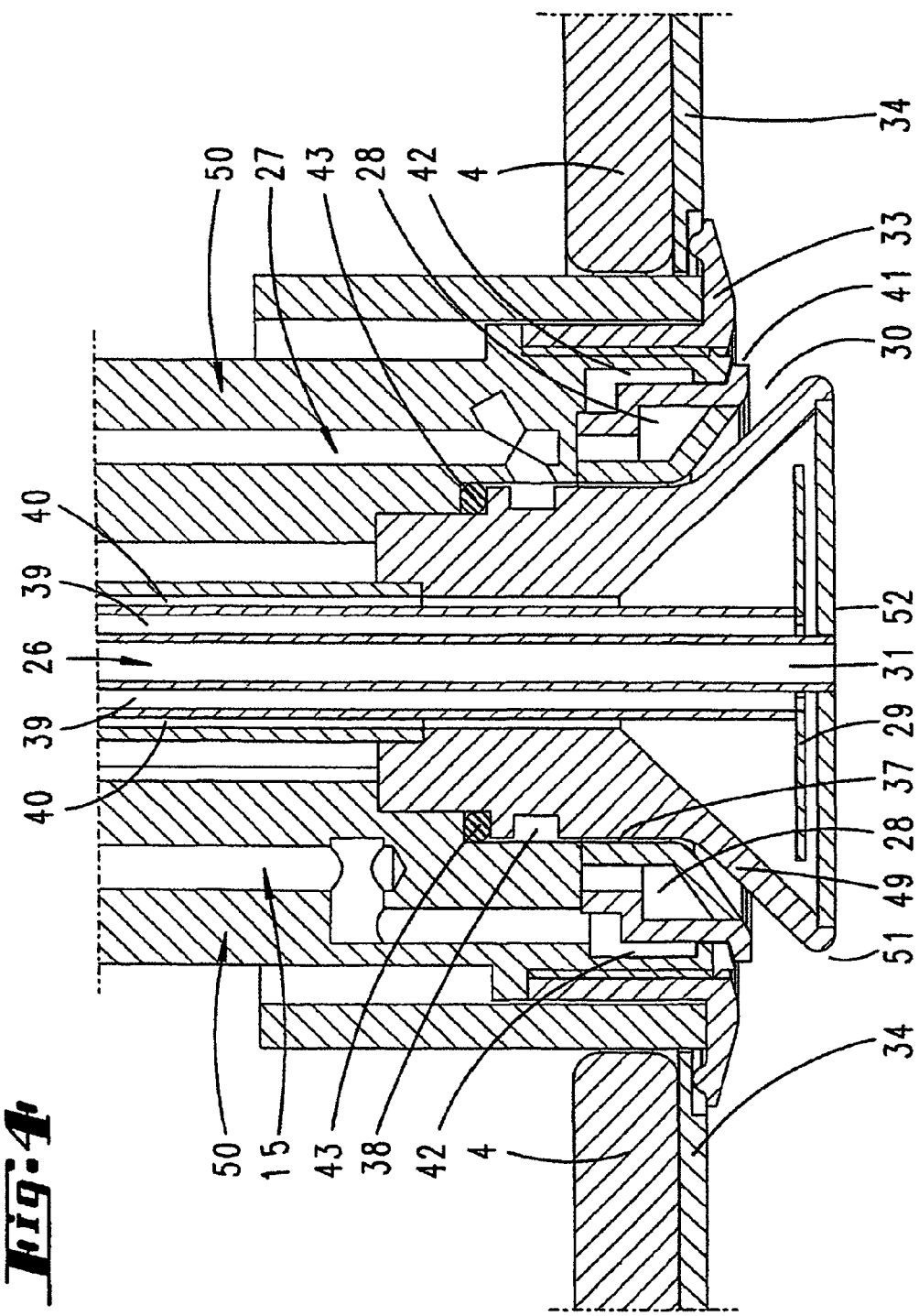

DEVICE AND METHOD FOR THE DEPOSITION OF, IN PARTICULAR, CRYSTALLINE LAYERS ON, IN PARTICULAR, CRYSTALLINE SUBSTRATES

This application is a continuation of pending International Patent Application No. PCT/EP01/08105 filed Jul. 13, 2001, which designates the United States and claims priority of pending German Application No. 10043601, filed Sep. 1, 2000.

FIELD OF THE INVENTION

The invention relates firstly to a device for depositing in particular crystalline layers on one or more, in particular likewise crystalline substrates in a process chamber by means of reaction gases which are introduced into the process chamber where they react pyrolytically, the process chamber having a first wall and a second wall, which lies opposite the first, and at least one heated substrate holder being associated with the first wall, at least one reaction gas being fed to the process chamber by means of a gas admission element.

The invention also relates to a method for depositing in particular crystalline layers on one or more, in particular likewise crystalline substrates in a process chamber by means of reaction gases which are introduced into the process chamber where they react pyrolytically, the process chamber having a first wall and a second wall, which lies opposite the first, and a substrate lying on a heated substrate holder which is associated with the first wall.

A device of the type described above is known from U.S. Pat. No. 4,961,399. In this device, the first wall is formed by a carrier plate which lies in the horizontal plane and on which substrate holders are disposed and mounted in such a manner that they rotate when the device is operating. The known device has a central gas admission element, through which the reaction gases are introduced into the process chamber. The device described in that document is used to deposit III-V semiconductor layers. This document mentions arsine and trimethylindium as reaction gases.

U.S. Pat. No. 5,788,777 likewise describes a device for depositing crystalline layers on crystalline substrates in a process chamber. In this case, silane and propane are fed as reactive gases to the process chamber through a central gas admission element. This device is used to deposit silicon carbide layers on single-crystalline silicon substrates. In the devices described and in the processes which are carried out using the devices, it is necessary to deal with the problem that silane decomposes at relatively low temperatures (approximately 500° C.), and the decomposition products do not remain in gas form at these temperatures, but rather condense out. Moreover, the condensation is adversely effected by the presence of propane and the decomposition products thereof.

DE 199 49 033.4, which was not published before the priority date, proposes avoiding premature decomposition of source gases and local super saturation of the gas stream with decomposition products by introducing process and carrier gas, which have been cooled to well below the process temperature, just in front of the hot substrate.

The invention is based on the object of proposing measures which prevent decomposition products from condensing out in the gas admission region.

The object is achieved by the invention which is described in the claims.

Claim 1 develops the device of the generic type in such a way that the gas admission element is liquid-cooled. According to claim 2, the method is carried out in such a way that two reaction gases, which are spatially at a spacing from one another and have been cooled to below their decomposition temperatures, are fed to the process chamber, the temperature at the location where the two reaction gases meet in the process chamber being higher than the saturation temperature of the decomposition products or possible adducts of the decomposition products. The reaction gases used are preferably silane and methane or propane, which are passed in each case through cooled feed lines into the hot zone of the process chamber. This may take place together with a carrier gas, for example hydrogen. Since the cooled feed lines extend as far as close to the hot surfaces of the process chamber, the reaction gases are heated suddenly. The decomposition products of silane, namely silicon atoms, and the decomposition products of methane/propane, namely carbon atoms, are accordingly, almost immediately after they have decomposed, in an environment which is at a temperature which is higher than the saturation temperature. There is then scarcely any further local super saturation. The decomposition products can be conveyed radially outward by the gas stream until they reach the substrate holders, which are driven in rotation in a known way, where they grow on the substrate to form a SiC single-crystal layer. The carrier gas and uncondensed reaction products are discharged through outlet openings of a gas discharge ring. The process can take place at low pressure (approximately 100 mbar). Growth rates of 10 µm/h or more can be achieved by selecting suitable process parameters. The feed line element is cooled by means of water or another suitable cooling liquid. A section of the feed line element which includes a cooling water chamber may project into the hot process chamber. A reaction gas, preferably silane, can emerge from a wall-cooled, annular wedge gap. The gap walls consist of steel. The wedge gap lies directly adjacent to a hot graphite wall, at a temperature of over 1000° C., preferably over 1500° C., of the process chamber. The wedge gap is connected via a very narrow annular gap to an annular chamber which is located in the gas admission element. A feed line opens out into this annular chamber from outside. The result of this is that the gas flows through the gap with a virtually uniform distribution in the circumferential direction and emerges uniformly in the radial direction. The other reaction gas, preferably methane or propane, leaves that section of the feed line element which projects into the process chamber through a central opening, which is the end of a central feed line. This opening lays on a base surface of the frustoconical section which projects into the process chamber. The base surface lies approximately centrally between the two heated walls. The frustoconical section is virtually completely hollow. In the hollow is located the cooling water, which is passed through the hollow by means of cooling water guide plates. A feed line and a discharge line for the cooling water are provided in the gas admission element. An annular carrier, which forms a radially protruding, bearing shoulder, is seated on the outer wall of the gas admission element. The carrier is preferably made from graphite. The cover plate, which is back-heated in particular by means of a high-frequency coil, is supported on this annular bearing shoulder. It is also possible for an insulating sleeve, which consists of carbon foam, to be located between the cover plate and the feed line element, which overall is cylindrical. There is also a cooling water chamber located between the outer wall, on which the carrier is seated, and the other wedge gap wall.

The invention furthermore relates to a refinement of the cover plate, which is fundamentally already known from U.S. Pat. No. 5,788,777, and the way in which it is held on the gas admission element. The epitaxial growth of SiC using the reaction gases silane and methane/propane requires an inert coating of both the carrier plate, which consists of graphite, and the cover plate, which likewise consists of graphite. The coating may consist of TaC or SiC. However, even cover or carrier plates which have been coated in this way are subject to wear, since the reaction gases have an etching action. According to the invention, the cover plate is lined with exchangeable lining rings, which may consist of TaC. The lining rings are held together by engaging beneath one another and support the cover plate. The inner edge of the innermost ring is located on the bearing shoulder of the carrier. In a variant of the invention, it is provided that the lining rings consist of graphite and are coated with TaC or SiC.

In a preferred configuration of the invention, the cover plate of the process chamber is seated securely on the lid of the reactor housing. The HF coil, which is likewise fixedly connected to the lid, is located between the reactor housing lid and the cover plate. If the lid is lifted in order to load substrates into or unload substrates from the process chamber, which can be carried out using suitable pneumatic cylinders, the HF coil and process chamber cover plate are also lifted at the same time.

The heating of the carrier plate takes place from below, likewise by means of a HF coil. The two HF coils may be fed by separate HF generators. This allows individual control of substrate temperature and cover temperature. The substrate temperature is approximately 1600° C. For this purpose, the carrier plate, which preferably consists of graphite, is heated to a temperature of from 1700° C. to 1800° C. The surface temperature of the cover plate, which consists of graphite, is approximately 1600° C. The region of the cover plate which directly adjoins the gas admission element is preferably also at such a high temperature. On account of the cooling, the gas admission element is at a temperature of less than 100° C.

BRIEF DESCRIPTION OF THE DRAWINGS

An exemplary embodiment of the invention is explained below with reference to appended drawings, in which:

FIG. 4 shows a further illustration in accordance with FIG. 4, with a section line which has been changed once again.

DETAILED DESCRIPTION OF THE DRAWINGS

Figure 1:
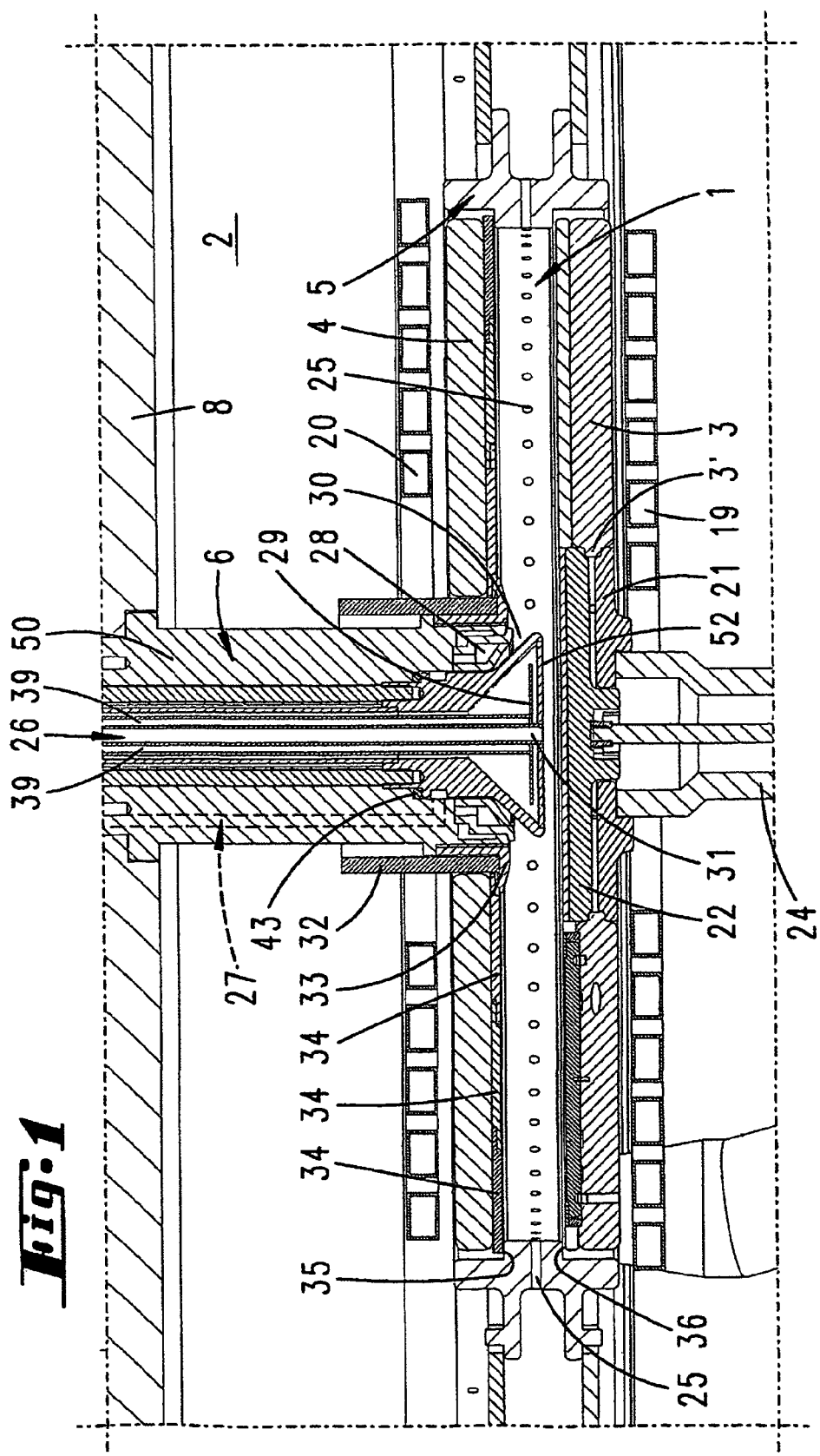
FIG. 1 shows, in diagrammatic representation, the reactor, comprising the process chamber, which is disposed in the reactor housing.
Figure 2:
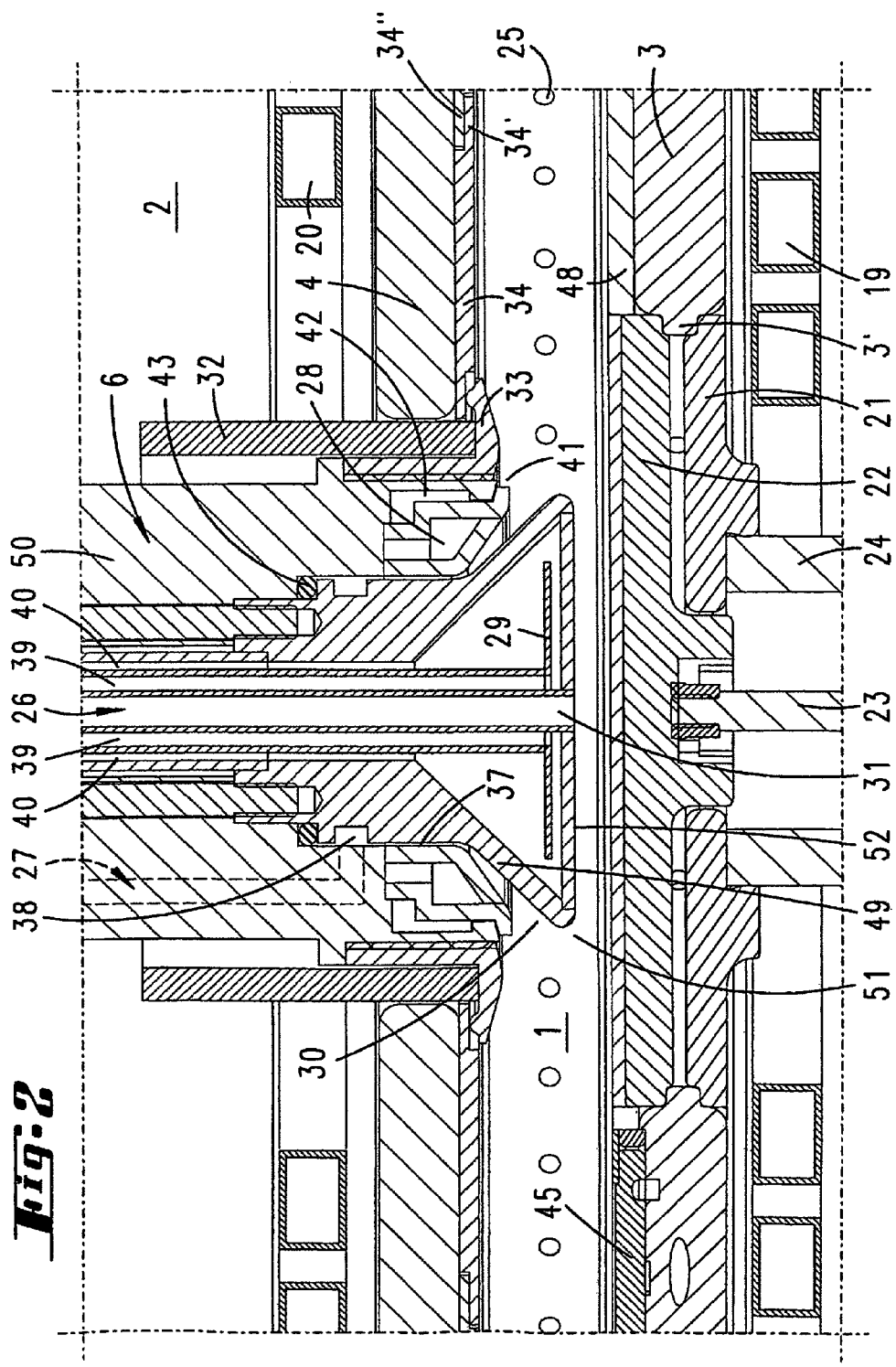
FIG. 2 shows a further enlarged view of part of the process chamber with gas admission element.
Figure 3:
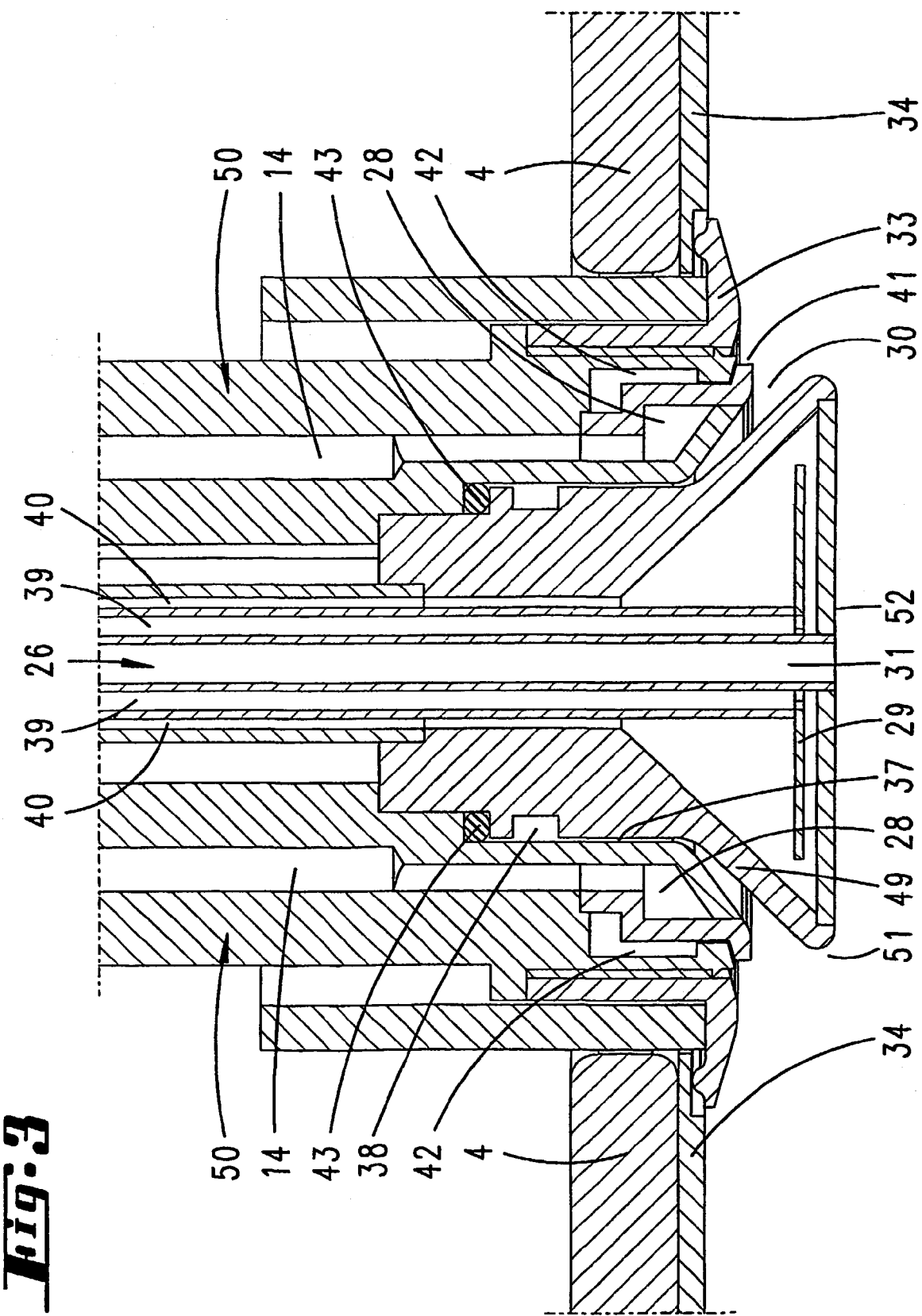
FIG. 3 illustrates the gas admission element in accordance with FIG. 3 with a changed section line through the gas admission element.

The device which is illustrated in the exemplary embodiment is used for the monocrystalline deposition of SiC layers on monocrystalline Si substrates in a hot-wall reactor. These substrates may have a diameter of 4 inches. The device is located in a housing (not shown in the drawings). The lid 8 of the reactor housing 2 can be opened upward. In the process, the lid 8, together with a gas admission element 6 secured to the lid, a high-frequency coil 20 which is likewise secured and a cover plate 4 which is secured to the gas admission element 6, lifts off. Furthermore, an upper housing wall section, which rests by way of seals on a lower housing wall section, also lifts off at the same time, so that the substrate holders 45 supported by the carrier plate 3 can be provided with substrates.

The process chamber 1 is located in the reactor housing 2. This process chamber 1 has a carrier plate 3 which carries the substrate holders 45. Above the carrier plate 3, a cover plate 4 extends parallel to it. The carrier plate 3 is heated from below by means of a water-cooled HF coil 19. The cover plate 4 is heated from above by a HF coil 20, which is likewise water-cooled. The carrier plate 3 is of annular configuration, the outer diameter being approximately twice as great as the inner diameter. The inner wall of the carrier plate 3 has an annular step 3' which projects radially inward. By means of this annular step 3', the carrier plate 3 rests on the edge of a support plate 21. The support plate 21 is in turn supported on a support tube 24, through which a tie rod 23 projects. The tie rod 23 engages approximately centrally on a tension plate 22 which is disposed above the support plate 21 and the edge of which rests on the collar 3'. The carrier plate 3 is held as if by clamping jaws by tension applied to the tie rod 23.

The carrier plate 3 and the cover plate 4 are surrounded by a gas discharge ring 5. This gas discharge ring 5 forms the lateral process chamber wall. The gas discharge ring 5 has a multiplicity of radial bores 25 through which the process gas can emerge. The gas discharge ring 5, like the support plate 21, the tension plate 22, the carrier plate 3 and the cover plate 4, is made from solid graphite. It is in single-piece form and has a width which approximately corresponds to the height of the process chamber 1. As a result, the gas discharge ring 5 has a relatively high heat capacity, with the result that the temperature profile within the process chamber is highly homogenous even at the edge. Since the gas discharge ring 5 forms a step 35 over which the cover plate 4 engages and a step 36 beneath which the carrier plate engages, in regions, it projects into the space between the cover plate 4 and the carrier plate 3.

On its underside, the cover plate 4 is lined with a total of three lining rings 34. These lining rings may consist of graphite or of TaC. They are held together like furnace rings by mutual engagement over one another, the innermost ring 34 being supported on an annular collar of a graphite carrier 33 which is screwed onto the lower end of the gas admission element 6. The lining rings 34 are rebated in the region where they lie one above the other. They form stepped ring sections 34', 34" lying above one another, so their surface does not have any steps in it.

The gas admission element 6 is overall of two-part configuration. It has a core, which forms a section 49 which projects into the process chamber 1 and is frustoconical in shape. This core is surrounded by a casing 50. The casing 50 is sealed with respect to the core 49 by means of a O-ring seal 43.

The silane is supplied through the feed line 27, which opens out into an annular chamber 38. The annular chamber 38 is adjoined by an annular gap 37, and the annular gap 37 is adjoined by an opening 30 which is in the shape of an annular wedge and through which the silane emerges. The wall of this outlet 30 is formed on one side by the core section 49 and on the other side by the casing 50. The walls of the passage 30 are cooled. Behind the passage walls there are cooling-water chambers 28, through which cooling water flows in order to keep the wall temperature below the decomposition temperature of the silane.

The cooling water passes through the cooling-water passage 39 and enters the cooling-water chamber 28 associated with the core 49, where it is guided along the wall by means of guide plates 29, in order to leave the cooling-water chamber 28 again through the passage 40.

The base surface 52, which is likewise held, as a result of application of cooling water from the back, at a temperature at which the reaction gases do not decompose, is located approximately in the center of the process chamber and runs parallel to the surface of the carrier plate 3. It is at a lesser spacing from the surface of the carrier plate than half the spacing between the cover plate 4 and the carrier plate 3. In the center of the base surface 52 is located the opening 31 of the methane or propane feed line 26. Hydrogen can enter the process chamber 1 through a purge passage 41. The process gases are likewise passed together with hydrogen through the feed lines 26, 27 associated with them.

In order to insulate the cover plate 4, which during operation of the device has been heated to approximately 1600° C., from the cooled gas admission element 6, there is an insulating sleeve 32, which surrounds the gas admission element and is made from a carbon foam, seated on the carrier 33.

Reference number 51 is used to indicate, by way of example, a location in the process chamber 1 where the decomposition products of silane meet up with those of methane or propane. At this point 51, the gas temperature is higher than the saturation temperature of the decomposition components, so that no super saturation effects occur.

The carrier plate 3 is driven in rotation via the supporting tube 24 and carries substrate holders 45 which are driven in rotation. The regions between the substrate holders 45 are filled by compensation plates 48. These rest loosely on the surface of the carrier plate 3. The surfaces of substrate holder 45 and compensation plate 48 are flush with one another. The compensation plates 48 are preferably made from TaC and exchangeable.

If the carrier plate 3 is heated from below, the temperature jump in the region between the horizontal joint between compensation plate 48 and carrier plate 3 is approximately the same as at the horizontal joint between substrate holder 45 and carrier plate 3.

The casing 50 has a plurality of bores which extend in the axial direction. One or more bores 27 are used to supply silane and open out into the annular chamber 38. One or more further bores 15 are used to supply hydrogen and open out in an annular passage 42, which is connected to an annular purge-gas outlet nozzle 41.

Cooling-water supply and discharge passages 14 run parallel to the passages 27 and 15. They open out into cooling-water chambers 28.

All features disclosed are (inherently) pertinent to the invention. The disclosure content of the associated/appended priority documents (copy of the prior application) is hereby incorporated in its entirety in the disclosure of the present application, partly with a view to incorporating features of these documents in claims of the present application.

What is claimed is:

1. A device for depositing in particular crystalline layers on one or more, in particular likewise crystalline substrates in a process chamber by means of reaction gases which are introduced into the process chamber where they react pyrolytically, the process chamber being disposed between a first wall and a second wall, which lies opposite the first, and the first wall forming at least one heated substrate holder and a gas admission element, which is a separate piece that extends through the second wall, a section of which gas admission element projects away from the second wall as far as approximately into the center between the two walls and by means of which gas admission element at least two reaction gases are fed into the process chamber spatially spaced apart from one another, characterized in that the gas admission element including the section which projects into the space between the two walls is cooled to a temperature which is lower than the decomposition temperature of the reaction gases, the gas admission element comprising a hollow portion, a base plate adjacent the hollow portion, a guide plate in the hollow portion and adjacent the base plate, and cooling-liquid supply and discharge passages that communicate a cooling liquid into the hollow portion between the guide plate and the base plate, over the base plate, and out of the hollow portion, the base plate having an outlet opening for a reaction gas and running parallel to the surface of the first wall.

2. The device according to claim 1, characterized in that the second wall of the process chamber is also heatable.

3. The device according to claim 1, characterized in that the gas admission element is water-cooled.

4. The device according claim 3, characterized in that the cooled section of the gas admission element has a cooling-water chamber.

5. A device for depositing in particular crystalline layers on one or more, in particular likewise crystalline substrates in a process chamber by means of reaction gases which are introduced into the process chamber where they react pyrolytically, the process chamber being disposed between a first wall and a second wall, which lies opposite the first, and the first wall forming at least one heated substrate holder and a water-cooled gas admission element having a cooling-water chamber being associated with the second wall, a section of which gas admission element projects away from the second wall as far as approximately into the center between the two walls and by means of which gas admission element at least two reaction gases are fed into the process chamber spatially spaced apart from one another, characterized in that the gas admission element including the section which projects into the space between the two walls is cooled to a temperature which is lower than the decomposition temperature of the reaction gases, a cooled base surface forming an outlet opening for a reaction gas and running parallel to the surface of the first wall, wherein a reaction gas emerges from an annular gap with cooled gap walls which consist of steel and lie directly adjacent to a graphite wall, which can be heated to over 1000° C., of the process chamber.

6. The device according to claim 5, wherein the graphite wall is heated to over 1500° C.

7. A device for depositing in particular crystalline layers on one or more, in particular likewise crystalline substrates in a process chamber by means of reaction gases which are introduced into the process chamber where they react pyrolytically, the process chamber being disposed between a first wall and a second wall, which lies opposite the first, and the first wall forming at least one heated substrate holder and a water-cooled gas admission element having a cooling-water chamber being associated with the second wall, a section of which gas admission element projects away from the second wall as far as approximately into the center between the two walls and by means of which gas admission element at least two reaction gases are fed into the process chamber spatially spaced apart from one another, characterized in that the gas admission element including the section which projects into the space between the two walls is cooled to a temperature which is lower than the decomposition temperature of the reaction gases, a cooled base surface forming an outlet opening for a reaction gas and running parallel to the surface of the first wall, wherein a reaction gas emerges from an annular gap with cooled gap walls which consist of steel and lie directly adjacent to a graphite wall, which can be heated to over 1000° C., of the process chamber, and wherein the annular gap is connected via a narrow annular gap to an annular chamber, into which a feed line opens out.

8. The device according to claim 7, characterized in that the section which projects into the process chamber is frustoconical in shape, the base surface lying approximately centrally between the two walls.

9. The device according to claim 8, characterized in that the frustoconical section is hollow and cooling water guide plates are disposed in the hollow.

10. The device according to claim 9, characterized by a carrier which is connected to the wall of the gas admission element, is made in particular from graphite and forms a bearing shoulder on which an annular, heated cover plate in particular made from graphite rests.

11. The device according to claim 10, characterized in that the cover plate lies above lining rings which support one another by engaging beneath one another, the edge of the inner ring resting on a bearing shoulder.

12. The device according to claim 11, characterized in that the lining rings consist of TaC or of TaC- or SiC-coated graphite.

13. The device according to claim 12, characterized in that the first wall forms an annular carrier plate for a plurality of in particular rotatable substrate holders.

14. The device according to claim 13, characterized in that the carrier plate is in the shape of a ring and is supported from below by a central support plate as a result of the edge of the latter engaging beneath it.

15. The device according to claim 14, characterized by a tension plate which lies above the support plate, is supported on the edge of the carrier plate and on which a tie rod acts.

* * * * *